United States Patent
Ish-Shalom et al.

(10) Patent No.: US 9,489,257 B2
(45) Date of Patent: Nov. 8, 2016

(54) CORRECTING SOFT RELIABILITY MEASURES OF STORAGE VALUES READ FROM MEMORY CELLS

(71) Applicant: Apple Inc., Cupertino, CA (US)

(72) Inventors: Tomer Ish-Shalom, Raanana (IL); Eyal Gurgi, Petah-Tikva (IL); Moti Teitel, Shoham (IL)

(73) Assignee: Apple Inc., Cupertino, CA (US)

( * ) Notice: Subject to any disclaimer, the term of this patent is extended or adjusted under 35 U.S.C. 154(b) by 83 days.

(21) Appl. No.: 14/499,207

(22) Filed: Sep. 28, 2014

(65) Prior Publication Data
US 2016/0092301 A1  Mar. 31, 2016

(51) Int. Cl.
*G11C 29/00* (2006.01)
*G06F 11/10* (2006.01)
*G11C 29/52* (2006.01)
*H03M 13/45* (2006.01)

(52) U.S. Cl.
CPC .......... *G06F 11/1068* (2013.01); *G11C 29/52* (2013.01); *H03M 13/45* (2013.01)

(58) Field of Classification Search
CPC ... G06F 11/1068; H03M 13/45; G11C 29/52
See application file for complete search history.

(56) References Cited

U.S. PATENT DOCUMENTS

| | | | |
|---|---|---|---|
| 8,000,135 B1* | 8/2011 | Perlmutter | G11C 11/5642 365/185.03 |
| 8,149,959 B1* | 4/2012 | Varnica | H04L 1/0054 375/340 |
| 2012/0236670 A1* | 9/2012 | Hemink | G11C 7/04 365/211 |
| 2013/0007559 A1 | 1/2013 | Motwani | |
| 2013/0145238 A1* | 6/2013 | Alhussien | H03M 13/23 714/786 |
| 2014/0010009 A1* | 1/2014 | Chilappagari | G11C 11/5642 365/185.2 |
| 2014/0040531 A1 | 2/2014 | Wu et al. | |
| 2014/0040704 A1 | 2/2014 | Wu et al. | |
| 2014/0112076 A1 | 4/2014 | Ish-Shalom et al. | |
| 2014/0112077 A1 | 4/2014 | Ish-Shalom et al. | |
| 2015/0006976 A1* | 1/2015 | Jeon | G06F 11/0751 714/54 |

* cited by examiner

*Primary Examiner* — Bryce Bonzo
*Assistant Examiner* — Thien D Nguyen
(74) *Attorney, Agent, or Firm* — Meyertons, Hood, Kivlin, Kowert & Goetzel, P.C.

(57) ABSTRACT

A method for data storage includes reading storage values, which represent stored data, from a group of memory cells using read thresholds, and deriving respective soft reliability metrics for the storage values. The storage values are classified into two or more subgroups based on a predefined classification criterion. Independently within each subgroup, a subgroup-specific distribution of the storage values in the subgroup is estimated, and the soft reliability metrics of the storage values in the subgroup are corrected based on the subgroup-specific distribution. The stored data is decoded using the corrected soft reliability metrics.

18 Claims, 3 Drawing Sheets

CORRECTING SOFT RELIABILITY MEASURES OF STORAGE VALUES READ FROM MEMORY CELLS

TECHNICAL FIELD

Embodiments described herein relate generally to memory devices, and particularly to methods and systems for reading memory cells.

BACKGROUND

In various storage systems, reading the data stored in a non-volatile memory involves decoding the data using soft reliability measures of respective storage values that represent the data. Decoding methods that utilize soft information are known in the art. For example, U.S. Patent Application Publication 2014/0040704, whose disclosure is incorporated herein by reference, describes an SSD controller reading from flash memory. Subsequent to failure of an initial soft-decision decoding attempt based on a nominal Log-Likelihood Ratio (LLR), soft-decision re-decoding attempts are made using compensated LLR soft-decision information sets. The compensated LLRs are pre-calculated at respective read-equilibrium points corresponding to mean shifts and variance change in the actual charge-state distributions of the flash memory channel. According to an embodiment, the attempts of soft-decision re-decoding are performed without a retry read, or alternatively overlapped with one or more retry reads.

As another example, U.S. Patent Application Publication 2013/0007559, whose disclosure is incorporated herein by reference, describes techniques for decoding storage levels in a non-volatile memory. A storage level of a cell in a multi-bit non-volatile memory is read. A minimum of Log-Likelihood Ratio (LLR) and a modified LLR to decode the storage level, wherein the modified LLR is a function of a misplacement probability is used. A value corresponding to the decoded level is written to a volatile memory.

As yet another example, U.S. Patent Application Publication 2014/0112076, whose disclosure is incorporated herein by reference, describes a method that includes storing data in a group of analog memory cells by writing respective analog values into the memory cells in the group. After storing the data, the analog values are read from the memory cells in the group one or more times using one or more respective read thresholds so as to produce readout results. Reliability measures are computed for the read analog values based on the readout results. An offset of the one or more read thresholds from an optimal read threshold position is estimated based on the reliability measures. The reliability measures are modified to compensate for the estimated offset, and the data stored in the analog memory cells in the group is decoded using the corrected reliability measures.

SUMMARY

An embodiment that is described herein provides a method for data storage, including reading storage values, which represent stored data, from a group of memory cells using read thresholds, and deriving respective soft reliability metrics for the storage values. The storage values are classified into two or more subgroups based on a predefined classification criterion. Independently within each subgroup, a subgroup-specific distribution of the storage values in the subgroup is estimated, and the soft reliability metrics of the storage values in the subgroup are corrected based on the subgroup-specific distribution. The stored data is decoded using the corrected soft reliability metrics.

In some embodiments, correcting the soft reliability metrics includes, independently within each subgroup, estimating an offset from optimality of the read thresholds based on the subgroup-specific distribution, deriving a subgroup-specific correction coefficient from the estimated offset, and applying the subgroup-specific correction coefficient to the soft reliability metrics. In other embodiments, applying the subgroup-specific correction coefficient includes subtracting the subgroup-specific correction coefficient from each of the soft reliability metrics in the subgroup.

In yet other embodiments, the method further includes holding multiple predefined reference distributions, and correcting the soft reliability metrics includes selecting from among the multiple reference distributions a reference distribution that is most similar to the subgroup-specific distribution, and correcting the soft reliability metrics based on the selected reference distribution.

In an embodiment, the reference distributions are classified based on the predefined classification criterion, and selecting the reference distribution includes choosing the reference distribution only among the reference distributions that are classified based on a same classification criterion as the storage values used for estimating the subgroup-specific distribution. In another embodiment, the method includes holding one or more predefined weight-vectors, and correcting the reliability metrics includes calculating a function of one or more weighted sums of the subgroup-specific distribution, which are weighted by the respective weight-vectors. In yet another embodiment, the storage values are associated with soft zones of the storage values, and correcting the soft reliability metrics includes correcting the soft reliability metrics using a separate respective zone correction coefficient in each soft zone.

In some embodiments, classifying the storage values includes assigning the storage values to the subgroups depending on respective levels of interference affecting the storage values. In other embodiments, the group of memory cells includes one or more word lines within an array of the memory cells, and classifying the storage values includes assigning the storage values to the subgroups depending on locations of the word lines to which the subgroups belong within the array.

There is additionally provided, in accordance with an embodiment that is described herein, apparatus for data storage including a memory including memory cells and storage circuitry. The storage circuitry is configured to read storage values that represent data from a group of the memory cells using read thresholds, to derive respective soft reliability metrics for the storage values, to classify the storage values into two or more subgroups based on a predefined classification criterion, to estimate, independently within each subgroup, a subgroup-specific distribution of the storage values in the subgroup, to correct the soft reliability metrics of the storage values in the subgroup based on the subgroup-specific distribution, and to decode the stored data using the corrected soft reliability metrics.

These and other embodiments will be more fully understood from the following detailed description of the embodiments thereof, taken together with the drawings in which:

DETAILED DESCRIPTION OF EMBODIMENTS

Overview

Figure 1:
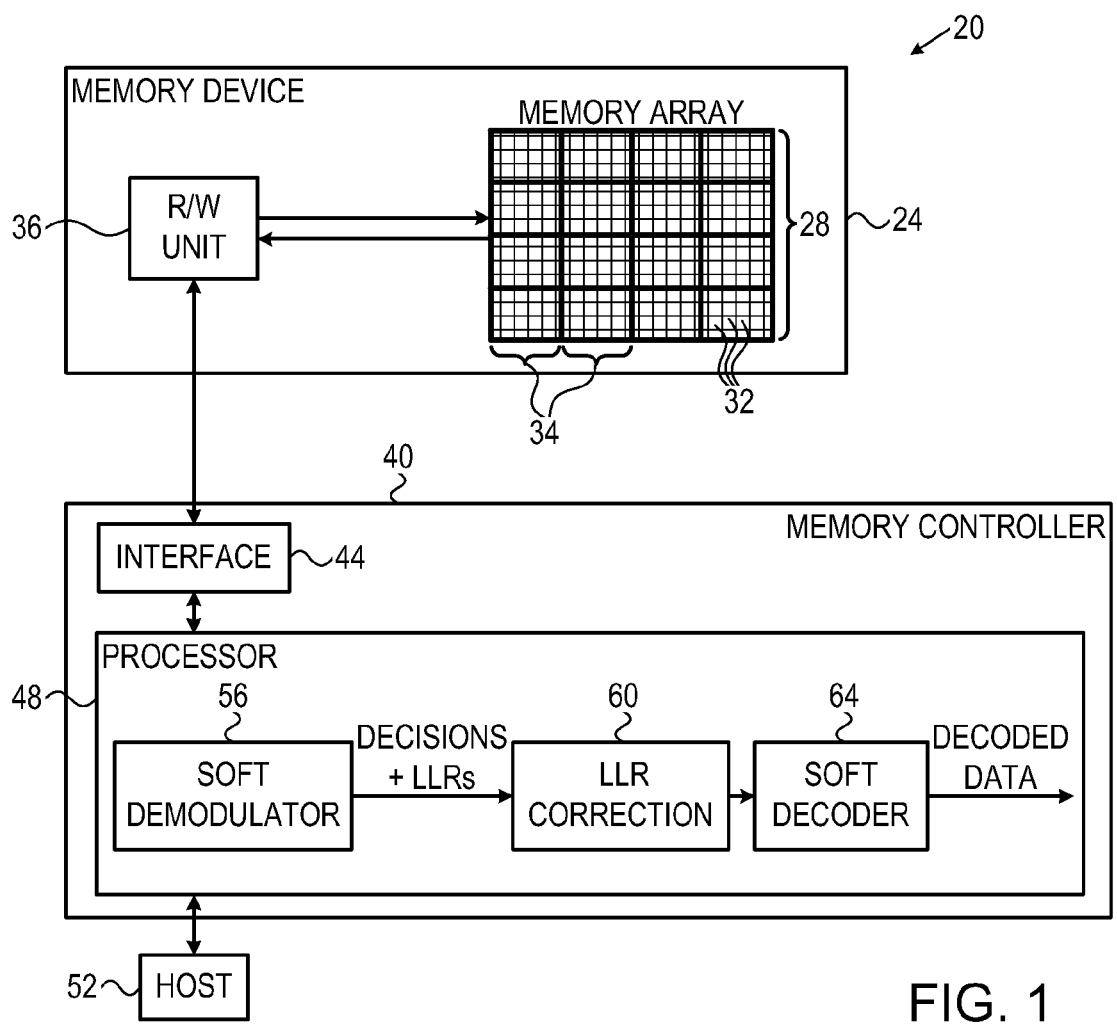
FIG. 1 is a block diagram that schematically illustrates a memory system, in accordance with an embodiment that is described herein.

Embodiments that are described herein provide improved methods and systems for reading data stored in memory cells, such as analog Flash cells. In some of the disclosed embodiments, a memory controller stores data in a group of memory cells by writing respective storage values (e.g., analog values) into the cells. In a NAND Flash device, for example, the programming operation sets the memory cells to respective threshold voltages that represent the stored data.

At a later time, the memory controller reads and decodes the stored data in a soft decoding process: The memory controller reads the memory cells in the group one or more times, using one or more respective read thresholds, so as to produce readout results. The memory controller then uses the readout results to derive soft reliability measures for the readout values.

The soft reliability measures may comprise, for example, Log Likelihood Ratios (LLRs) for the possible bit values that may be stored in the memory cells. The memory controller decodes the stored data based on the soft reliability measures. The soft reliability measures are also referred to as soft reliability metrics. In the description that follows, the terms "soft reliability measures," "reliability measures," "soft reliability metrics" and "reliability metrics" are used interchangeably.

In some embodiments, the memory controller derives the LLR values in respective soft zones (or simply zones for brevity) of the storage values. The soft zones may correspond to respective intervals between adjacent read thresholds. The memory controller typically assigns a respective predefined LLR value to the readout values that fall within each soft zone, wherein the predefined LLR values are typically predetermined offline assuming optimal (or other nominal) positioning of the read thresholds. In alternative embodiments, the memory controller derives the LLRs by converting the readout values into soft LLR measures using an Analog to Digital Converter (ADC). The interface over which the stored data is retrieved from the memory is also referred to herein as a discrete channel.

Various optimality criteria can be used for determining the optimal position of the read thresholds. One such criterion comprises maximizing the Mutual Information (MI) of the discrete channel. Another criterion comprises minimizing the Bit Error Rate (BER) for the main threshold (typically the central threshold) and then setting additional read thresholds in the vicinity of the main threshold, so as to maximize the MI of the discrete channel. Yet another criterion comprises minimizing the BER for the main threshold (typically the central threshold) and using a fixed set of additional read thresholds in the vicinity of the main threshold.

Note that in the disclosed techniques it is not mandatory that the LLRs are determined using optimal read thresholds. In some embodiments, the LLRs are determined using suboptimal positioning of the read thresholds, and when reading data from the memory, the actual LLRs are corrected so as to compensate for possible offset between the actual read thresholds and the read thresholds used for LLRs determination.

In some practical scenarios, the read thresholds used for reading the memory cells may be positioned sub-optimally, for various reasons. The sub-optimality can be represented by an offset between the actual position of the read thresholds and the position of the read thresholds that were used to determine the LLRs. Sub-optimal positioning of read thresholds typically distorts the reliability measures, and thus increases the probability of read errors. Optimality and sub-optimality can be defined, for example, in terms of maximizing Mutual Information (MI) or minimizing Bit Error Rate (BER).

As will be described below, the optimal position of the read thresholds may not be uniform across the entire group of the memory cells to be read, and thus may differ among different subgroups of the memory cells. For example, different memory cells may experience different levels of interference depending, for example, on the data written in the memory cells of interfering word lines. Different levels of interference may translate to different optimal read threshold positions. As another example, the position of the optimal read thresholds may depend on the location of the word line within the memory array, e.g., a first or last word line as opposed to a middle word line.

In some embodiments that are described herein, the memory controller classifies the storage values read from a group of memory cells (i.e., using the same read thresholds for the entire group) into two or more subgroups based on a predefined classification criterion. Note that classifying the storage values is equivalent to classifying the memory cells from which the storage values are retrieved. Examples of classification criteria are given further below.

The memory controller estimates, independently for each subgroup, a subgroup-specific distribution (e.g., a histogram) of the storage values, and modifies the reliability measures of the storage values in the subgroup based on the estimated distribution. Typically, the memory controller performs reliability measures correction based on the initial readout results of the sub-optimal read thresholds, without reading the memory cells again.

The memory controller then decodes the stored data using the modified reliability measures. By using reliability measures that are corrected or modified based on subgroup-specific distributions, the decoding operation is able to achieve improved error probability performance. The achievable performance may approach the performance that would be achieved by optimal positioning of the read thresholds, separately for each of the subgroups. Since the correction is performed without re-reading the memory cells, latency and power consumption are reduced.

The memory controller may estimate the subgroup-specific distribution and modify the reliability measures of the storage values in the respective subgroup in various ways. In some of the disclosed embodiments, the memory controller estimates, per subgroup, an offset of the read thresholds from their optimal position, and then maps the estimated offset into a subgroup-specific correction coefficient.

In an embodiment, the memory controller holds multiple predefined reference distributions, each associated with respective offset value. For a given subgroup, the memory controller estimates the offset between the position of the actual read thresholds and the position of the read thresholds that was used for determining the nominal LLRs, as the offset value that is associated with a matching distribution that is most similar (in accordance with some given metric, e.g., the Kullback-Leibler divergence) to the subgroup-specific distribution, among the reference distributions.

In some embodiments, the memory controller pre-classifies the predefined reference distributions based on the same classification criterion that is used for classifying the storage values. For example, the reference distributions can be classified into high-interference and low-interference distributions. Thus, instead of searching the entire set of reference distributions, the memory controller searches for the matching distribution only among those reference distributions that are classified based on the same classification criterion by which the subgroup of storage values was classified.

In other embodiments, the memory controller holds one or more predefined weight-vectors, which are derived from the predefined classification criterion of the storage values, and estimates the offset from optimality as a function of one or more coefficients, each calculated by a sum of the bins of the subgroup-specific distribution weighted by the elements of a respective weight-vector plus an additive constant.

As described above, the memory controller maps the estimated offset in each subgroup into a subgroup-specific correction coefficient. In an embodiment, the memory controller calculates the correction coefficient by multiplying the estimated offset by a predefined multiplicative constant and adding a predefined additive constant. In some embodiments these multiplicative and additive constant depend on the soft zone and therefore the memory controller calculates a separate correction coefficient for each soft zone. In some embodiments, the correction coefficient is calculated as a polynomial function of the index of the respective soft zone, wherein the estimated offset and additional correction factors serve as the polynomial coefficients.

In some embodiments, the subgroup-specific distribution is mapped directly (i.e., without explicit intermediate calculation of an estimated offset) to a subgroup-specific correction coefficient. The direct mapping comprises calculating a weighted sum of the distribution bins and a predefined weight vector (which may depend on the subgroup), and adding a predefined additive factor. In some embodiments, a separate additive factor is defined per soft zone, resulting in separate correction coefficients per zone (and subgroup).

In some embodiments, the memory controller stores, per soft zone, a zone-specific nominal LLR, and estimates a LLR correction value, which is common to all the soft zones using, for example, the methods described above. The memory controller then calculates an LLR correction coefficient for each of the zones by applying a per-zone function (e.g., a linear function) to the common LLR correction value. The memory controller calculates the final per-zone LLR value as the sum of the per-zone nominal LLR and the LLR correction coefficient. In some embodiments, the memory controller calculates the per-zone correction coefficient as a linear function of one of the nominal LLRs (e.g., the leftmost LLR).

Some of the disclosed techniques are based on statistical modeling of the storage values and reliability measures. In accordance with one statistical model, the distribution of the storage values that are associated with a given logical level is modeled as a mixture distribution comprising two or more Gaussian distributions, wherein each mixture component corresponds to a different interference level, and wherein the Gaussian distributions may have different variances. Based on this model an expression for the reliability measure as a function of the offset can be derived, and decomposed into even and odd parts.

This model leads to an implementation in which the memory controller calculates the correction coefficient per zone as a two-coefficient linear function of the zone index. In some embodiments, the linear functions depend on the level of interference, i.e., using different linear functions for different interference levels.

In some embodiments, the memory controller calculates the coefficients of the linear function using an estimated distribution (e.g., a histogram) of the storage values, and two respective predefined vectors. In an embodiment, different such vectors are used for different levels of interference. One of the predefined vectors is related to the derivative of the even part, and the other vector to the odd part of the reliability measure expression.

In the disclosed techniques, when reading a group of memory cells, the memory controller identifies subgroups of the storage values that should be read using different positioning of the read thresholds, as opposed to assuming a common optimal position for the entire group. In each subgroup, the memory controller corrects the reliability measures by estimating an offset of the read thresholds from their optimal or nominal positions, and mapping the estimated offset into a subgroup-specific correction coefficient.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules, Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple memory cells 32. Although in the example of FIG. 1 memory cells 32 comprise analog memory cells, in alternative embodiments, other types of memory cells can also be used. In the context of the present patent application, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device.

Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present disclosure, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^7$ memory cells, whereas a page is on the order of $10^4$-$10^5$ memory cells.

The description that follows describes several example techniques for reading and decoding the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Compensation for Non-Optimal Read Thresholds Using Subgroup-Specific LLR Correction In the example configuration of FIG. 1, processor 48 of memory controller 40 decodes the data stored in a group of memory cells 32. Typically, processor 48 instructs R/W unit 36 to read the group of memory cells one or more times, using one or more respective read thresholds, so as to produce readout results. In such a readout scheme, the memory controller is provided with one or more hard readout results for each memory cell in the group. The memory controller then derives soft reliability measures for the various data bits, and decodes the data using the soft reliability measures.

The description that follows refers mainly to Log Likelihood Ratios (LLRs) that are derived for the respective data bits. The disclosed techniques, however, are not limited to LLRs and can be used with any other suitable type of soft reliability measures. Typically, the reliability measures are signed, i.e., comprise both magnitude and sign information.

Typically, memory controller 40 aims to position the read thresholds at an optimal position on the threshold voltage ($V_{TH}$) axis, which minimizes the probability of read errors. The optimal position of the read threshold can be defined, for example, as the position that yields the maximum Mutual Information (MI) or minimum Bit Error Rate (BER). The optimal position typically lies in a boundary region between adjacent programming levels (as demonstrated, for example, in FIG. 2A below).

In practice, however, the read thresholds may not always be positioned at the optimal position, for various reasons. When the read thresholds are positioned in a different position relative to the position that was used for determining the LLRs, at least some of the hard decoded bits are assigned with sub-optimal LLRs, which results in degraded error correction capability of the decoder. In some embodiments, processor 48 in memory controller 40 compensates for this sub-optimality by adjusting the LLRs.

In the example configuration of FIG. 1, processor 48 comprises a soft demodulator 56, which receives the multiple readout results obtained using the one or more read thresholds and uses them for soft demodulation. For each memory cell, demodulator 56 produces a hard decision that estimates the data value stored in the cell, and a positive valued reliability measure that quantifies the reliability assigned to the hard decision. Each LLR typically comprises a sign, which is indicative of the hard decision or bit value, and an absolute value indicative of the reliability of that bit value. As explained above, the disclosed techniques can be used with various signed reliability measures.

An LLR correction module 60 modifies the LLRs produced by demodulator 56 so as to compensate for the offset of the read thresholds from their optimal position. In some embodiments, module 60 first estimates the offset, and then corrects the LLRs based on the estimated offset. In the description that follows, the offset of the read thresholds from their optimal position (i.e., the position that was used for determining the mapping between soft zones and LLR values) is also referred to as "offset from optimality" or simply "offset," for brevity. In some embodiments, the determination of LLRs is done offline using nominal read thresholds that deviate from the optimal read thresholds. In such embodiments, the term "offset from optimality" refers to the offset between the actual read thresholds and the nominal read thresholds.

As described above, in some of the disclosed embodiments, the memory controller classifies the storage values retrieved in two or more subgroups based on a predefined criterion, and separately adjusts the LLRs that are assigned to the respective storage values in each subgroup.

In an example embodiment, module 60 estimates the offset based on the distribution of cell threshold voltages in the subgroup relative to the various read thresholds. This subgroup-specific distribution may be represented by a "zone histogram." In an embodiment, the zone histogram corresponding to T read thresholds is defined as a vector of length T+1, such that the first vector element holds the estimated number of memory cells whose voltage level lies below all thresholds, the last element holds the estimated number of cells whose voltage level lies above all thresholds, and for $k=2, \ldots, T$, the $k^{th}$ vector element holds an estimation of the number of cells whose voltage level lies between the $(k-1)^{th}$ smallest threshold and the $k^{th}$ smallest threshold.

Note that the number of cells in each vector element (zone histogram bin) is an estimate, as some cells may respond or fail to respond to a read threshold due to read noise. Furthermore, some cells may react to a low threshold but not to higher thresholds. This phenomenon may be corrected using suitable processing or ignored, since the number of such cells is likely to be small.

A soft decoder 64 then decodes the data stored in the group of memory cells based on the corrected LLRs within the various subgroups. Typically, the stored data is encoded with an Error Correction Code (ECC), such as a Low Density Parity Check (LDPC) code or a Bose-Chaudhuri-Hocquenghem (BCH) code, and decoder 64 decodes the ECC using the modified LLRs. Effectively, decoder 64 can be viewed as correcting erroneous hard decisions of demodulator 56.

The internal structure of processor 48 shown in FIG. 1 is given purely by way of example. Any other suitable configuration can also be used in alternative embodiments. The various processor modules (e.g., demodulator 56, LLR correction module 60 and decoder 64) may be implemented in software, in hardware, or both.

Figure 2A:
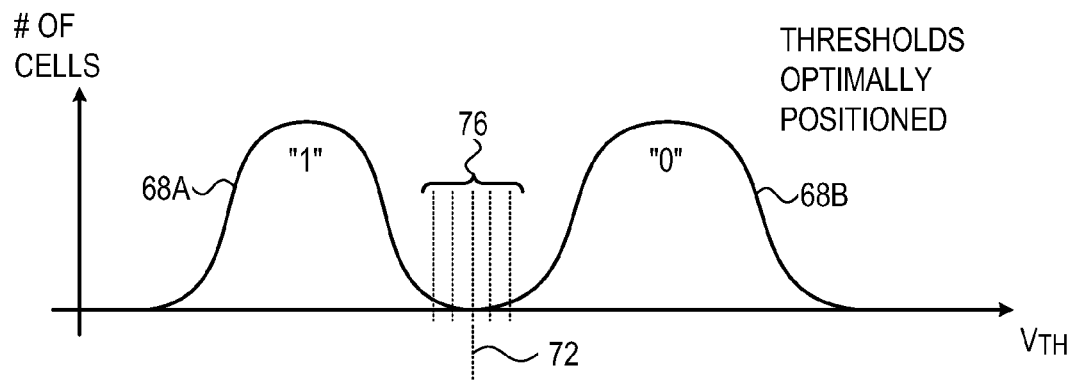
FIGS. 2A and 2B are graphs showing programming level distributions in two subgroups of memory cells, and associated respective read thresholds, in accordance with an embodiment that is described herein.
Figure 2B:
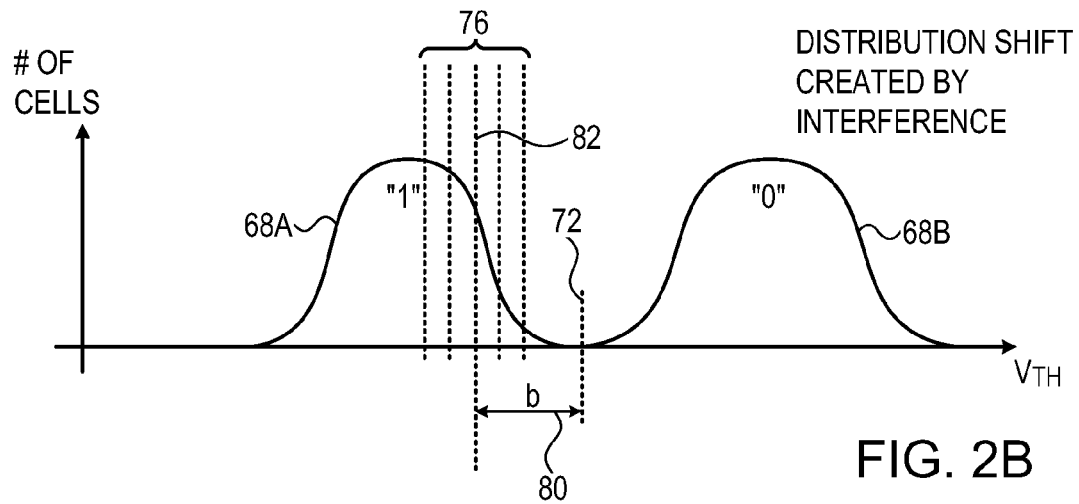

FIGS. 2A and 2B are graphs showing programming level distributions in two subgroups of memory cells, and associated respective read thresholds, in accordance with an embodiment that is described herein. The group of memory cells typically belongs to a given word line or multiple word lines, and used for storing one or more data pages. For the sake of clarity, the present example refers to two programming levels, each representing a single bit value. Generally, however, the disclosed techniques are also applicable to MLC devices, which use more than two programming levels, each representing a multi-bit value.

In MLC devices, memory cells whose threshold voltages fall in two separate soft zones, each in the vicinity of a different pair of programming levels, may be regarded by the memory controller as belonging to a single merged zone. For example, reading the MSB page in a 2bits/cell MLC involves setting a set of read thresholds between the first and second programming levels, and another set of read thresholds between the third and fourth programming levels.

The memory controller may regard a pair of soft zones in which one zone is associated with the first set of thresholds and the other with the second set of thresholds, as a single merged zone. To split the cells in a merged zone to the respective separate zones, the memory controller may read one or more lower significant pages and use these pages for zone separation. The disclosed techniques apply to both merged zones and separated zones.

FIGS. 2A and 2B refer to an SLC memory device, and show the threshold voltage distributions of the two programming levels 68A and 68B, which represent data values "1" and "0", respectively. In the present example, FIG. 2A depicts the threshold voltage distribution in a first subgroup of the group of memory cells, which experience little or no interference. FIG. 2B, on the other hand, depicts the threshold voltage distribution in a second subgroup whose memory cells experience crosstalk interference from a neighboring word line. As seen in the figures, the threshold voltages of the memory cells in the interfered subgroup are typically higher than in the non-interfered subgroup.

In order to perform readout from the memory cells in the group, the read thresholds are to be placed in the boundary region between the two programming levels. The optimal read threshold position (e.g., resulting in minimal BER) is marked by a line 72. Note that the optimal thresholds of the second (interfered) subgroup in FIG. 2B should be positioned higher than the optimal read thresholds of the first (non-interfered) subgroup in FIG. 2A.

Memory controller 40 reads the entire group of memory cells using a common set of five read thresholds 76. Thus, the memory controller reads each of the memory cells in the group five times, using each of the respective five thresholds 76. For example, when the group comprises the memory cells along a given word line, the entire group of memory cells is read using a single set of read thresholds. As such, the position of the read thresholds may be suboptimal for at least one of the subgroups.

In the example of FIG. 2A, read thresholds 76 are positioned optimally, whereas in FIG. 2B read thresholds 76 are positioned sub-optimally. As described above, R/W unit 36 reads each memory cell five times, using the five read thresholds. Soft demodulator 56 produces a respective LLR for each memory cell, based on the five readout results of that cell. (In alternative embodiments, any other suitable number of read thresholds can be used, and the read thresholds need not necessarily be distributed at uniform intervals.)

In some embodiments, demodulator 56 divides the threshold voltage axis into soft zones, e.g., using the read thresholds. Thus, the leftmost and rightmost soft zones correspond to respective threshold voltages below and above the lowest and highest read thresholds and the other soft zones correspond to the intervals between adjacent read thresholds. Demodulator 56 holds a predefined mapping between the soft zones and LLR values so that the storage values that lie within a given soft zone are assigned a common predefined LLR value.

As can be seen in FIG. 2B, read thresholds 76 for the interfered subgroup are centered about line 82 (and not about line 72) and are therefore not positioned optimally. An offset 80 (denoted b) exists between optimal position 72 and the actual position of the read thresholds. (In this example the offset is measured from the middle of the interval occupied by the read thresholds, although other conventions can also be used.) The size of offset b depends, for example, on the level of the interference that the memory cells in the subgroup experience. The size of Offset b may also depend on the positioning of read thresholds 76.

In some embodiments, LLR correction module 60 estimates the size of offset 80, and corrects the LLRs in the interfered subgroup as a function of the estimated offset. The corrected LLRs are provided to soft decoder 64 for decoding. Note that offset from optimality in the non-interfered subgroup of FIG. 2A is zero and therefore the LLRs in this subgroup need not be corrected.

LLR correction module 60 may estimate offset 80, and modify the LLRs as a function of the offset, in various ways. Since an LLR is defined as a logarithm of a ratio of probabilities, it may take negative or positive values. (As explained above, the disclosed techniques can alternatively be used with other sorts of reliability measures having sign and magnitude information.)

Module 60 may compute a correction coefficient for the LLRs in each subgroup, and then subtract the subgroup-specific correction coefficient from the LLRs of the respective subgroup. Several methods for estimating the offset and mapping the estimated offset into a respective subgroup-specific correction coefficient are described in relation with FIG. 3 below.

The disclosed techniques are applicable to symmetrical distributions of the reliability measures, in which the distributions 68A and 68B have the same variance, and to asymmetrical distributions, in which distributions 68A and 68B have different variances.

When using the above technique in an MLC device having more than two programming levels, each pair of adjacent programming levels is typically distinguished by a different read threshold. Typically, processor 48 performs the above operation (classifying the voltage values into subgroups, computing of the offset per subgroup, mapping the offset to a subgroup-specific correction coefficient, and subtraction of the correction coefficient from the LLRs) independently for each such read threshold.

In some embodiments, the memory controller estimates part of offset b by various means. For example, the memory controller may first determine the interference level, and then estimate a respective expected offset based on the interference level. As another example, the memory controller may estimate an offset of the read thresholds, e.g., due to threshold voltage drift, using any suitable method. The memory controller may apply any suitable method for compensating for the estimated part of b, and use the disclosed techniques for compensating for the remaining part of b.

When using the above techniques in conjunction with an interference cancellation process, processor 48 performs the above operation (computing of the subgroup-specific correction coefficient and subtraction from the LLRs) independently for each subgroup of the group of memory cells having a common interference level.

Although FIGS. 2A and 2B refer mainly to SLC devices, the disclosed techniques are applicable also to MLC devices. The memory controller can estimate the interference level that a subgroup of the MLC cells experiences, for example, by sensing a set of interfering word lines and applying one (in case of a hard decision) or more (in case of soft decisions) sense operations for some or all of the interferers.

Alternatively, LLR correction module 60 may estimate offset 80, and correct the LLRs based on the estimated offset, using any other suitable technique.

Figure 3:
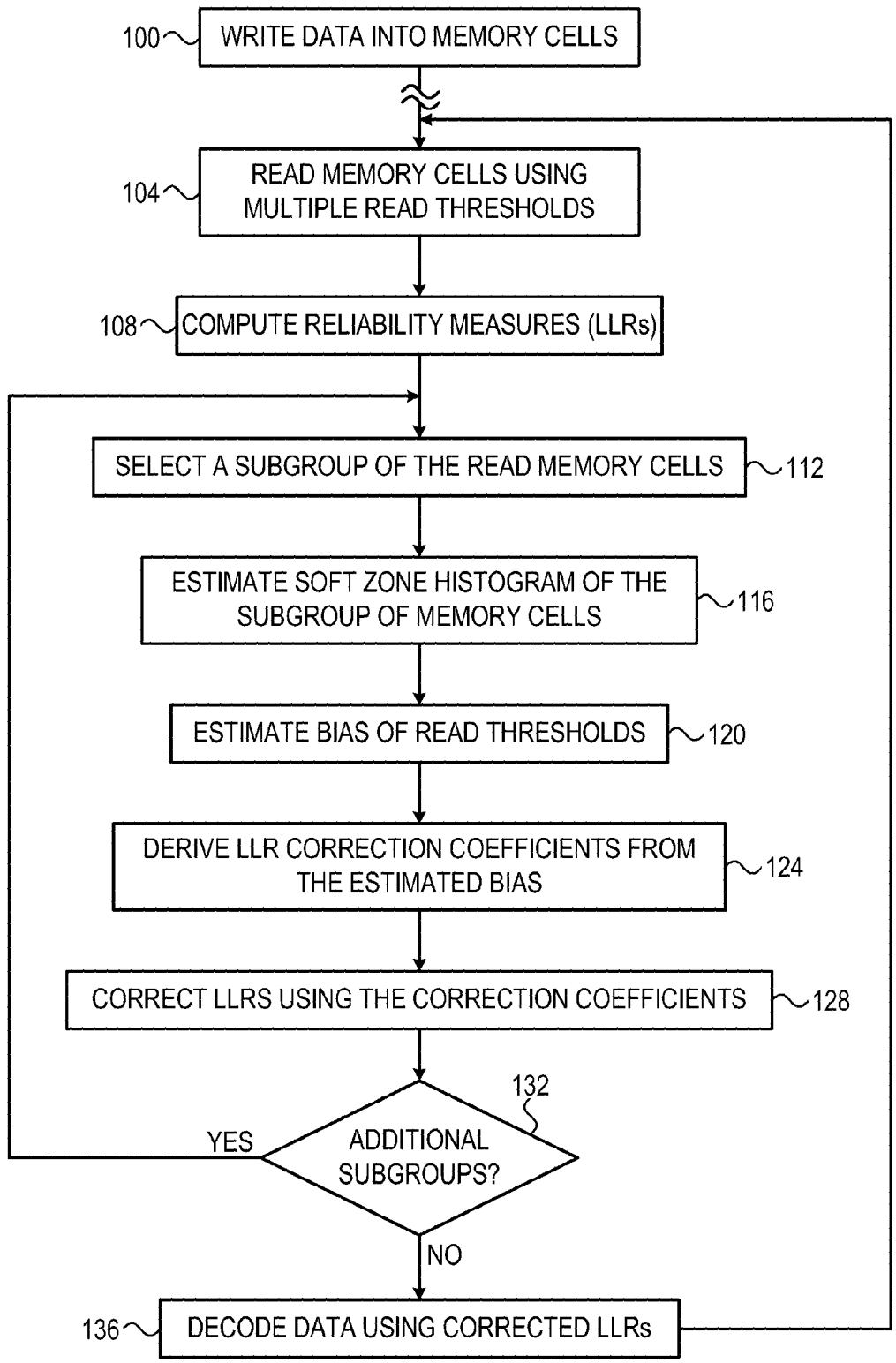
FIG. 3 is a flow chart that schematically illustrates a method for reading a group of memory cells, in accordance with an embodiment that is described herein.

FIG. 3 is a flow chart that schematically illustrates a method for reading a group of memory cells, in accordance with an embodiment that is described herein. The method begins with the storage circuitry (memory controller 40 and R/W unit 36) writing data into a group of memory cells 32, at a programming step 100.

At a later time, the storage circuitry reads the group of memory cells using multiple read thresholds, at a readout step 104. Soft demodulator 56 computes reliability measures, including hard decisions (e.g., LLRs) for the stored data bits based on the readout results, at a demodulation step 108.

At a subgroup selection step 112, LLR correction module 60 classifies the storage values from which the LLRs were produced into two or more subgroups. LLR correction module 60 may use any suitable classification criterion for classifying the storage values (or respective LLRs or memory cells) into subgroups. In an example embodiment, the classification criterion is based on world line location within the memory array (e.g., first, last or middle word line). In another embodiment, the classification criterion is based on the interference level created by memory cells of neighboring word lines. In yet other embodiments, the classification criterion is based on the bit significance of the page being read, such as a Last Significant Bit (LSB) or Most Significant Bit (MSB) page.

Next, module 60 performs steps 116-128 that are described below per each subgroup independently, and therefore the description of steps 116-128 refers to the memory cells and respective LLRs of the subgroup that is being processed.

At a distribution estimation step 116, LLR correction module 60 estimates a distribution of the storage values per subgroup. As described above, the distribution can be represented by a histogram whose bins count the number of cells in each soft zone. At an offset estimation step 120, module 60 uses the estimated subgroup-specific distribution to estimate the offset of the actual read thresholds from their optimal position. LLR correction module 60 can use various techniques for estimating the offset, as described herein.

In one embodiment, LLR correction module 60 estimates the offset by storing multiple predefined reference distributions, and associated offsets from optimality values 80. In some embodiments, the reference distributions are additionally classified based on the predefined classification criterion used for classifying the storage values into subgroups (e.g., classify in accordance with the level of interference of the subgroup).

When reading a particular group of memory cells, module 60 calculates the actual distribution of each subgroup, and finds a matching reference distribution, which is most similar to the subgroup-specific distribution. In an embodiment, module 60 searches for the matching distribution only among the reference distributions that are classified using the same criterion as the respective subgroup.

Let g denote the index of the subgroup being processed. The subgroup-specific offset $b_g$, which is associated with the most similar distribution, is regarded as the estimated offset for subgroup g. Module 60 may find the most similar distribution using any suitable method, such as using the Kullback-Leibler divergence, or the Minimum Mean Square Error (MMSE) among the bins of the estimated and reference distributions.

In another embodiment, processor 48 stores, per subgroup g, a predefined weight-vector $W_g=W_g(0) \ldots W_g(N)$, and calculates the offset $b_g$ as a weighted sum of the subgroup-specific distribution $H_g$ having N bins, as given in Equation 1.

$$b_g = W_g(0) + \sum_{k=1}^{N} H_g(k) \cdot W_g(k) \qquad \text{Equation 1}$$

In yet another embodiment, processor 48 stores an additional weight-vector $U_g=U_g(0) \ldots U_g(N)$ and calculates a multiplicative correction factor $a_g$ as given in Equation 2. The correction factors $b_g$ and $a_g$ can be used for calculating the LLR correction coefficient as will be described at step 124 below.

$$a_g = U_g(0) + \sum_{k=1}^{N} H_g(k) \cdot U_g(k) \qquad \text{Equation 2}$$

At a correction coefficient calculation step 124, module 60 maps the estimated offset $b_g$ into a subgroup-specific correction coefficient $C_g$. In some embodiments, module 60 calculates the correction coefficient $C_g$ as a linear function of the offset $b_g$. For example, in one embodiment module 60 calculates $C_g$ predefined factors S1 and S2, i.e., $C_g=S1 \cdot b_g + S2$. In another embodiment, the factors S1 and S2 depend on the soft zone (bin) k, i.e., the memory controller holds a separate predefined factor $S1(k)$ and $S2(k)$ for each zone $k=1 \ldots N$. In these embodiments module 60 corrects the LLRs that fall within the boundaries of zone k using the correction coefficient $C_g(k)=S1(k) \cdot b_g + S2(k)$.

In some embodiments, the correction coefficient depends on two correction factors, e.g., $a_g$ and $b_g$ as given in Equations 1 and 2 above. In such embodiments, module 60 calculates the correction coefficient per zone $k=1 \ldots N$ as $C_g(k)=b_g+a_g \cdot k$. In alternative embodiments, module 60 can map the estimated offset of the subgroup into a subgroup-specific correction coefficient using any suitable function F(k) of the zone index k, such as, for example, F(k) may be a polynomial in k with coefficients that are derived from the subgroup-specific histogram (similarly to calculating $b_g$ and $a_g$ in Equations 1 and 2 above).

In some embodiments, the memory controller maps the subgroup-specific histogram $H_g$ directly to a subgroup-specific correction coefficient $C_g$, i.e., without using the subgroup-specific offset $b_g$. For example, the memory controller holds for each subgroup g a weight-vector $W_g=W_g(1) \ldots W_g(N)$, and an additive factor $D_g(k)$ per zone, and calculates a correction factor per zone by adding $D_g(k)$ to the weighted sum of the histogram bins by the weight-vector $W_g$.

Module 60 then corrects the subgroup LLRs as a function of the correction coefficients $C_g(k)$, at a correction step 128. In an example embodiment, module 60 corrects the LLRs whose storage values belong to subgroup g and soft zone k, by subtracting from each LLR the correction coefficient $C_g(k)$. In an embodiment in which the correction coefficient $C_g$ does not depend on the zone k, module 60 subtracts $C_g$ from the LLRs of the subgroup independently of the zone in which the respective storage values of the LLRs lie.

At a loop termination step 132, if there are additional subgroups in which the LLRs should be corrected, module 60 loops back to step 112 to select subsequent subgroups. Otherwise, the LLRs are assumed corrected, and module 60 proceeds to a decoding step 136, in which soft decoder 64 decodes the stored data using the corrected LLRs. The decoded data is provided as output, and processor 48 loops back to step 104 to read another group of memory cells.

As explained above, the processing at steps 116-128 compensates for the offset of the read threshold from optimality in a given subgroup. In other words, the corrected LLRs are similar to the LLRs that would be obtained if the optimal positions of the read thresholds were known a-priori and used, when reading the storage values of the given subgroup. In other words, the offset, when exists, creates a mismatch between the nominal LLRs (i.e., that were determined offline) and the actual LLRs derived over the observed discrete channel, and processing steps 116-128 compensate for this mismatch by correcting the actual LLRs to approximate the nominal LLRs.

In addition, the processing at steps 116-128 is performed purely by computation, without having to actually move the read thresholds to the optimal position and re-read the memory cells. Therefore, latency and power consumption are reduced. Moreover, as the read thresholds for different subgroups of the memory cells may be offset by a different amount from the optimal position, a subgroup-specific correction is applied.

In some embodiments, however, processor 48 does move the read thresholds to the estimated optimal position (as defined above, based on the estimated offset) in preparation for the next readout operation. The next readout may be from the same group of memory cells or from a different group.

Correcting Zone LLRs Using Linear Approximation

In some embodiments, the correction coefficients of the LLRs behave approximately linear as a function of the soft zone index k. These embodiments use only a small number of predefined coefficients and are therefore robust and require small storage space.

In one embodiment, the memory controller stores the predefined LLR value only for the leftmost zone for which the zone index is k=0, and calculates a corrected LLR for this zone using, for example, the disclosed techniques. The memory controller then derives the LLRs of the zones for which k>0 as a linear function of the corrected LLR. For example, LLR_CORRECTED(k>0) equals LLR_CORRECTED(k=0)+C·k, wherein C is a predefined constant. Alternatively, the memory controller first calculates uncorrected LLRs as a linear function of the uncorrected LLR, i.e., LLR_UNCORRECTED(k>0) equals LLR_UNCOR- RECTED(k=0)+C·k, and then corrects each of the uncorrected LLRs using, for example, the techniques disclosed above.

The configurations described in the embodiments above are exemplary, and any other suitable configurations can also be used. For example, the predefined constants and vectors used in the various disclosed techniques can be determined offline using any suitable method. As another example, in some embodiments, the memory controller can use five read thresholds, which define six soft zones. Alternatively, the memory controller can use any suitable numbers of read thresholds and soft zones. Although in some of the disclosed embodiments, the memory controller estimates the offset as a linear function of the bins of subgroup-specific distribution, in alternative embodiments, any suitable non-linear function can also be used.

Model-Based LLR Correction

Some practical embodiments can be derived using statistical modeling of the storage values and LLRs. Assume a statistical model of the storage values that are retrieved from the memory cells, which is similar to a Binary Input Continuous Output Additive White Gaussian Channel (BI-AWGNC) as given by:

$$y = x + b + n, n \sim \mathcal{N}(0, \sigma^2), x \in \{-1, 1\} \quad \text{Equation 3:}$$

In Equation 3, $x \in \{-1, 1\}$ represents the nominal voltage value stored in the memory cells, n represents an additive component that has a Gaussian distribution having a variance $\sigma^2$, b is the unknown offset of the read thresholds from their optimal position, and y represents the storage values read from the memory cells. The nominal storage values in Equation 3 are selected as 1 and −1 by way of example. Alternatively, any other suitable nominal voltage levels can be used. Based on the model in Equation 3, the optimal LLR for a given storage value y, given the offset b, is given by:

$$L_y(b) = \log \frac{\frac{1}{\sqrt{2\pi\sigma^2}} e^{-\frac{(y-b-1)^2}{2\sigma^2}}}{\frac{1}{\sqrt{2\pi\sigma^2}} e^{-\frac{(y-b+1)^2}{2\sigma^2}}} = 2\frac{y-b}{\sigma^2} = L_y(b=0) - \frac{2b}{\sigma^2} \quad \text{Equation 4}$$

Since LLRs that are assigned to respective storage values y were determined assuming zero offset, i.e., b=0, the mean value of these LLRs is given by:

$$l = \int_{-\infty}^{\infty} \frac{2z}{\sigma^2} f(z+b) dz = \frac{2b}{\sigma^2} \quad \text{Equation 5}$$

wherein the distribution function f(y) is given by:

$$f(y) \triangleq \frac{1}{2} \frac{1}{\sqrt{2\pi\sigma^2}} e^{-\frac{(y-1)^2}{2\sigma^2}} + \frac{1}{2} \frac{1}{\sqrt{2\pi\sigma^2}} e^{-\frac{(y+1)^2}{2\sigma^2}} \quad \text{Equation 6}$$

From Equations 4 and 5 above we conclude a relationship between the value of the LLRs in the presence of a bias b, and the LLRs that are assigned assuming zero bias as follows:

$$L_y(b) = L_y(b=0) - l \quad \text{Equation 7:}$$

In an embodiment, which is based on the result in Equation 7, to correct the LLRs that are derived under the assumption of zero offset, the memory controller subtracts the mean value of the nominal LLRs, i.e., the LLRs derived assuming b=0, wherein the mean LLR value is taken over the observed distribution. An embodiment in which correcting the LLRs involves subtracting the mean LLR value is described, for example in U.S. Patent Application Publication 2014/0112076, cited above.

Now we extend the model given in Equation 3 above to a distribution function f(n) which is symmetrical about zero, has a zero mean, but is not necessarily Gaussian.

$$y = x + b + n, n \sim f(n), x \in \{-1, 1\} \quad \text{Equation 8:}$$

In the model of Equation 8 we further assume that the read storage values y are quantized symmetrically, i.e., the statistical properties of the storage values can be modeled as a Binary Input Quantized Output Symmetric Channel (BI-QOSC). Let d denote a vector of the quantization decision points:

$$d \equiv [d_{-N} = -\infty, d_{-N+1}, \ldots, d_0 = 0, \ldots, d_{N-1}, d_N] \quad \text{Equation 9:}$$

The optimal LLR in the presence of a bias b for storage values in the range (zone) $d_n < y \leq d_{n+1}$ is given by:

$$L_n(b) = \log \frac{\int_{b+d_n}^{b+d_{n+1}} f(t-1) dt}{\int_{b+d_n}^{b+d_{n+1}} f(t+1) dt}, n = -N, \ldots, N-1 \quad \text{Equation 10}$$

To analyze the dependence of the average LLR on the bias b, we compute the average LLR over two antipodal zones, i.e., $y \in [d_{-n}, d_{1-n}] \cup [d_{n-1}, d_n]$. Using, in addition, the assumption of symmetrical quantization, i.e., $L_{n-1}(0) = -L_{-n}(0)$ we get:

$$\bar{L}_n^{av}(b) = \quad \text{Equation 11}$$

$$\frac{L_{n-1}(0)}{S_n(b)} \sum_{x \in \{-1, 1\}} \left[ \int_{b+d_{n-1}}^{b+d_n} f(y-x) dy - \int_{b+d_{-n}}^{b+d_{1-n}} f(y-x) dy \right]$$

$$S_n(b) \triangleq \sum_{x \in \{-1, 1\}} \left[ \int_{b+d_{n-1}}^{b+d_n} f(y-x) dy + \int_{b+d_{-n}}^{b+d_{1-n}} f(y-x) dy \right],$$

$$n = 0, \ldots, N-1$$

The average LLR $\bar{L}_n^{av}(b)$ (per zone n) is an odd function of the bias b, and therefore when expending $\bar{L}_n^{av}(b)$ to a Taylor series, the even terms in the expansion vanish. As a result, up to a second order, $\bar{L}_n^{av}(b)$ can be approximated by a linear function of b.

$$\bar{L}_n^{av}(b) = C_n \cdot b \quad \text{Equation 12:}$$

An expression for the correction coefficient $C_n$ can be derived using the following two definitions:

$$A_n(b) \triangleq \sum_{x \in \{-1, 1\}} \int_{b+d_{n-1}}^{b+d_n} f(y-x) dy, n = 0, \ldots, N-1 \quad \text{Equation 13}$$

$$B_n(b) \triangleq \sum_{x \in \{-1, 1\}} \int_{b+d_{-n}}^{b+d_{1-n}} f(y-x) dy, n = 0, \ldots, N-1$$

Using the definitions in Equation 13, and assuming quantization decision points that are symmetrical about zero, $C_n$ can be written as:

$$C_n = 2L_{n-1}(0) \frac{B_n(b)A'_n(b) - A_n(b)B'_n(b)}{[A_n(b) + B_n(b)]^2}\bigg|_{b=0}$$

$$= 4L_{n-1}(0) \frac{\left(\sum_{x \in \{-1,1\}} \int_{d_{n-1}}^{d_n} f(y-x)dy\right)}{[A_n(0) + B_n(0)]^2} \cdot (\Sigma_{x \in \{-1,1\}}[f(d_n - x) - f(d_{n-1} - x)])$$

$$= L_{n-1}(0) \frac{\Sigma_{x \in \{-1,1\}}[f(d_n - x) - f(d_{n-1} - x)]}{2\Sigma_{x \in \{-1,1\}} \int_{d_{n-1}}^{d_n} f(y-x)dy}$$

Equation 14

In some embodiments, a linear relationship in which $I_n^{av}(b)$ and $I_n^{av}(0)$ in Equation 12 are replaced with $L_y(b)$ and $L_y(0)$, respectively can be used. In such embodiments, $C_n$ is replaced with a suitable multiplicative factor that can be determined offline. Such embodiments typically operate in two steps. First, the memory controller estimates the offset b, and then uses the estimated offset to derive the LLR correction coefficient.

In accordance with yet another model, the read storage values are assumed to be distributed in accordance with a Gaussian model as given in Equation 15:

$$f_i(x) = \frac{1}{\sqrt{2\pi\sigma_i^2}} e^{\frac{(x-b-\mu_i)^2}{2\sigma_i^2}}, i = 0, 1$$

Equation 15

In Equation 15, x represents the read storage values, b represents the offset of the read thresholds from their optimal position, and $b+\mu_i$ and $\sigma_i^2$ are the mean and variance of the $i^{th}$ Gaussian distribution, $i \in \{0,1\}$. Based on Equation 15, and assuming $\mu = \mu_0 = -\mu_1$, the LLR as a function of the offset b is given by:

$$LLR(x, b) = \log \frac{f_0(x, b)}{f_1(x, b)}$$

$$= \frac{1}{2} \log \frac{\sigma_1^2}{\sigma_0^2} + [(x-b)^2 + \mu^2]$$

$$\left(-\frac{1}{2\sigma_0^2} + \frac{1}{2\sigma_1^2}\right) + 2\mu$$

$$(x-b)\left(\frac{1}{2\sigma_0^2} + \frac{1}{2\sigma_1^2}\right)$$

Equation 16

The expression for LLR(x,b) in Equation 16, can be decomposed into even and odd parts, i.e., $L_e(x, b)$ and $L_o(x, b)$, respectively, as follows:

$$LLR(x,b) = L_e(x,b) + L_o(x,b)$$

Equation 17

The even and odd parts are given in Equations 18 and 19 below.

$$L_e(x, b) = \frac{1}{2}\log\frac{\sigma_1^2}{\sigma_0^2} + [(x-b)^2 + \mu^2]\left(-\frac{1}{2\sigma_0^2} + \frac{1}{2\sigma_1^2}\right)$$

Equation 18

$$L_o(x, b) = 2\mu(x-b)\left(\frac{1}{2\sigma_0^2} + \frac{1}{2\sigma_1^2}\right)$$

Equation 19

Now we develop an expression for the LLR correction coefficient. To this end, we start with the expressions for the even and odd parts assuming zero offset or b=0 in Equations 18 and 19 above.

$$L_e(x, 0) = \frac{1}{2}\log\frac{\sigma_1^2}{\sigma_0^2} + [x^2 + \mu^2]$$

Equation 20

$$L_o(x, 0) = 2\mu x\left(\frac{1}{2\sigma_0^2} + \frac{1}{2\sigma_1^2}\right)$$

Equation 21

Evaluating conditional (given the bias b) expectation values of the partial derivative of the even part and of the odd part results in the following expressions:

$$E[\partial_x L_e(x, 0) | b] = 2b\left(-\frac{1}{2\sigma_0^2} + \frac{1}{2\sigma_1^2}\right)$$

Equation 22

$$E[L_o(x, 0) | b] = 2\mu b\left(\frac{1}{2\sigma_0^2} + \frac{1}{2\sigma_1^2}\right)$$

Equation 23

From Equations 18, 20 and 22 we get:

$$L_e(x, b) = L_e(x, 0) - E[\partial_x L_e(x, 0) | b] \cdot x + c$$

$$c = \left(-\frac{1}{2\sigma_0^2} + \frac{1}{2\sigma_1^2}\right)b^2$$

Equation 24

When the offset is small, or b<<1, we can ignore the element c in Equation 24 and get the approximate expression:

$$L_e(x,b) = L_e(x,0) - E[\partial_x L_e(x,0)|b] \cdot x$$

Equation 25:

From Equations 19, 21 and 23 above we get:

$$L_o(x,b) = L_o(x,0) - E[L_o(x,0)|b]$$

Equation 26:

Using the expressions given in Equations 25 and 26 in Equation 17 above, we get:

$$LLR(x,b) = LLR(x,0) - (E[\partial_x L_e(x,0)|b] \cdot x + E[L_o(x,0)|b])$$

Equation 27:

As seen in Equation 27, the LLR correction coefficient is a linear function of the storage value x:

$$LLR(x,b) = LLR(x,0) - C(x), C(x) = EC \cdot x + OC$$

$$EC = E[A(x)|b], A(x) = \partial_x L_e(x,0)$$

$$OC = E[B(x)|b], B(x) = L_o(x,0)$$

Equation 28:

We now describe an embodiment, which is based on the model given in Equations 15 and 16 above, and implements LLR correction in accordance with Equation 28. In an embodiment, the memory controller evaluates an approximation of Equation 28 at a zone level. In other words, the memory controller associates the storage values x read from a group of memory cells with respective predefined zones of the threshold voltage axis, and calculates a common correction coefficient C(k) for the LLRs whose respective storage values lie in each zone k.

To implement Equation 28, the storage values x are replaced with their respective zone index k. The memory controller holds predefined values of LLR(k, 0), A(k) and B(k), which are evaluated and stored beforehand per zone, as will be described further below. The memory controller evaluates the LLR correction coefficient C(k) by calculating the conditional expected values EC and OC of Equation 28 using an estimated distribution H(k) that counts the number of storage values that belong to each zone k:

$$EC = \sum_k H(k) \cdot A(k)$$  Equation 29

$$OC = \sum_k H(k) \cdot B(k)$$

Finally, the memory controller performs the LLR correction by calculating for the LLRs whose respective storage values belong to zone k:

$$LLR(k)=LLR(k,0)-(EC \cdot k+OC)$$  Equation 30:

As described above, the memory controller stores predefined values of LLR(k, b=0), A(k) and B(k), that are evaluated offline per zone k, using any suitable method. For example, LLR(k, 0) can be evaluated using a set of reading thresholds, wherein the intervals between adjacent thresholds define the zones. Alternatively, LLR(k, 0) can be evaluated using a suitable Analog to Digital Converter (ADC).

The even part $L_e(k,0)$ can be calculated as $L_e(k,0)=[LLR(k,0)+LLR(-k,0)]/2$, assuming symmetrical zone indexing. Similarly for the odd part: $L_o(k,0)=[LLR(k,0)-LLR(-k,0)]/2$. The vector A(k) is then evaluated by calculating a discrete derivative of Le(k,0) using any suitable method. The elements of vector B(k) equal the respective Lo(k,0) values.

Although the embodiments described herein mainly address correcting reliability measures to improve the decoding of data in a memory device, the methods and systems described herein can also be used in other applications, such as in decoding in communication systems.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
reading a plurality of storage values, which represent stored data, from a group of memory cells using read thresholds;
deriving a respective one of a plurality of soft reliability metrics for each one of the plurality of storage values;
classifying each one of the plurality of storage values into a given one of two or more subgroups based on a predefined classification criterion;
independently within each subgroup of the two or more subgroups, estimating a subgroup-specific distribution corresponding to the storage values in each subgroup;
correcting the respective soft reliability metric for each storage value in each subgroup based on the subgroup-specific distribution; and
decoding the stored data using the corrected soft reliability metrics.

2. The method according to claim 1, wherein correcting the respective soft reliability metric comprises, independently within each subgroup, estimating an offset from optimality of the read thresholds based on the subgroup-specific distribution, deriving a subgroup-specific correction coefficient from the estimated offset, and applying the subgroup-specific correction coefficient to each one of the plurality of soft reliability metrics.

3. The method according to claim 2, wherein applying the subgroup-specific correction coefficient comprises subtracting the subgroup-specific correction coefficient from each one of the plurality of soft reliability metrics in each subgroup.

4. The method according to claim 1, wherein correcting the respective soft reliability metric comprises selecting from among multiple predefined reference distributions, a given reference distribution that is most similar to the corresponding subgroup-specific distribution, and correcting the respective soft reliability metric based on the given reference distribution.

5. The method according to claim 4, wherein the multiple predefined reference distributions are classified based on the predefined classification criterion, and wherein selecting the given reference distribution comprises choosing the given reference distribution from a subset of the multiple predefined reference distributions that are classified based on a same classification criterion as used for classifying the plurality of storage values.

6. The method according to claim 1, wherein correcting the respective soft reliability metric comprises calculating a function of one or more weighted sums of the subgroup-specific distribution, which are weighted by one or more predefined weight-vectors.

7. The method according to claim 1, wherein each one of the plurality of storage values is associated with a given one of a plurality of soft zones, and wherein correcting the respective soft reliability metric comprises correcting the plurality of soft reliability metrics using a separate respective zone correction coefficient in each one of the plurality of soft zones.

8. The method according to claim 1, wherein classifying each one of the plurality of storage values comprises assigning each one of the plurality of storage values into a given one of the two or more subgroups depending on respective levels of interference affecting each one of the plurality of storage values.

9. The method according to claim 1, wherein the group of memory cells comprises one or more word lines within an array of memory cells, and wherein classifying each one of the plurality of storage values comprises assigning each one of the plurality of storage values into the given one of the two or more subgroups depending on locations of the one or more word lines within the array.

10. An apparatus, comprising:
a memory including an array of memory cells; and
storage circuitry configured to:
read a plurality of storage values, which represent stored data from a group of the memory cells using read thresholds;
derive a respective one of a plurality of soft reliability metrics for the plurality of storage values;
classify each one of the plurality of storage values into a given one of two or more subgroups based on a predefined classification criterion;

estimate, independently within each subgroup of the two or more subgroups, a subgroup-specific distribution corresponding to the storage values in each subgroup;

correct the respective soft reliability metric for each storage value in each subgroup based on the subgroup-specific distribution; and decode the stored data using the corrected soft reliability metrics.

11. The apparatus according to claim 10, wherein to correct the respective soft reliability metric, the storage circuitry is further configured to estimate, independently within each subgroup, an offset from optimality of the read thresholds based on the subgroup-specific distribution, to derive a subgroup-specific correction coefficient from the estimated offset, and to apply the subgroup-specific correction coefficient to each one of the plurality of soft reliability metrics.

12. The apparatus according to claim 10, wherein the storage circuitry is further configured to subtract the subgroup-specific correction coefficient from each one of the plurality of soft reliability metrics in each subgroup.

13. The apparatus according to claim 10, wherein the storage circuitry is further configured to:

select from among multiple predefined reference distributions, a given reference distribution that is most similar to the corresponding subgroup-specific distribution, and correct the respective soft reliability metric based on the given reference distribution.

14. The apparatus according to claim 13, wherein the multiple predefined reference distributions are classified based on the predefined classification criterion, and wherein the storage circuitry is further configured to choose the given reference distribution from a subset of the multiple predefined reference distributions that are classified based on a same classification criterion as used for classifying the plurality of storage values.

15. The apparatus according to claim 10, wherein to correct the respective soft reliability metric, the storage circuitry is further configured to calculate a function of one or more weighted sums of the subgroup-specific distribution, which are weighted by one or more predefined weight-vectors.

16. The apparatus according to claim 10, wherein each one of the plurality of storage values is associated with a given one of a plurality of soft zones, and wherein the storage circuitry is further configured to correct the plurality of soft reliability metrics using a separate respective zone correction coefficient in each one of the plurality of soft zones.

17. The apparatus according to claim 10, wherein to classify each one of the plurality of storage values, the storage circuitry is further configured to assign each one of the plurality of storage values into a given one of the two or more subgroups dependent upon respective levels of interference affecting each one of the plurality of storage values.

18. The apparatus according to claim 10, wherein the array of memory cells is arranged in one or more word lines, wherein the group of memory cells comprises one or more word lines within the array, and wherein to classify each one of the plurality of storage values, the storage circuitry is further configured to assign each one of the plurality of storage values into the given one of the two or more subgroups dependent upon locations of the word lines within the array.

* * * * *